(12) United States Patent
Chen

(10) Patent No.: US 11,140,777 B2
(45) Date of Patent: Oct. 5, 2021

(54) INTERFACE CIRCUIT, CHIP CONTAINING INTERFACE CIRCUIT AND MANUFACTURING METHOD THEREOF

(71) Applicant: SHENZHEN SANDIYIXIN ELECTRONIC CO., LTD., Guangdong (CN)

(72) Inventor: Xiangbing Chen, Shenzhen (CN)

(73) Assignee: SHENZHEN SANDIYIXIN ELECTRONIC CO., LTD., Shenzhen (CN)

( * ) Notice: Subject to any disclaimer, the term of this patent is extended or adjusted under 35 U.S.C. 154(b) by 548 days.

(21) Appl. No.: 16/076,626

(22) PCT Filed: Jul. 20, 2017

(86) PCT No.: PCT/CN2017/093707
§ 371 (c)(1),
(2) Date: Aug. 8, 2018

(87) PCT Pub. No.: WO2018/161490
PCT Pub. Date: Sep. 13, 2018

(65) Prior Publication Data
US 2021/0037643 A1 Feb. 4, 2021

(30) Foreign Application Priority Data
Mar. 8, 2017 (CN) .......................... 201710133923.8

(51) Int. Cl.
*H05K 1/02* (2006.01)
*H03K 19/0175* (2006.01)
(52) U.S. Cl.
CPC ... *H05K 1/0292* (2013.01); *H03K 19/017509* (2013.01)

(58) Field of Classification Search
CPC ........................... H05K 1/0292; H05K 1/0286
See application file for complete search history.

(56) References Cited

U.S. PATENT DOCUMENTS 6,166,559 A * 12/2000 McClintock ......... G11C 29/808
326/10
7,251,805 B2 * 7/2007 Koo .................... G06F 30/30
326/41
(Continued)

FOREIGN PATENT DOCUMENTS

CN 101355358 1/2009
CN 101937665 1/2011
(Continued)

OTHER PUBLICATIONS

International search report dated Dec. 13, 2017 from corresponding application No. PCT/CN2017/093707.
(Continued)

*Primary Examiner* — Anh Q Tran
(74) *Attorney, Agent, or Firm* — Hauptman Ham, LLP

(57) ABSTRACT

Disclosed is an interface circuit, a chip containing an interface circuit and a manufacturing method thereof. The interface circuit includes an I/O processing sub-circuit, a path selection sub-circuit, and at least two I/O ports. The I/O processing sub-circuit, the path selection sub-circuit, and the at least two I/O ports are electrically connected in sequence. The path selected by the path selection sub-circuit can enable a first and a second electrical signal to be transmitted through the I/O ports that are configured to correspond to the ports of the external device through which the first and second electrical signals are transmitted. That is, the path selection sub-circuit can customize the layout of the signal-input/output I/O ports of the interface circuit according to the layout of the ports of the external device.

18 Claims, 4 Drawing Sheets

(56) References Cited

U.S. PATENT DOCUMENTS

2004/0054821 A1\* 3/2004 Warren ................ H04L 69/18
710/8
2011/0260752 A1\* 10/2011 Jouin ................ H03K 19/1732
326/41

FOREIGN PATENT DOCUMENTS

| CN | 102622330 A | 8/2012 |
|----|-------------|--------|
| CN | 202395805   | 8/2012 |
| CN | 202425018   | 9/2012 |
| CN | 103646665   | 3/2014 |
| EP | 0257201     | 3/1988 |

OTHER PUBLICATIONS

First Office Action issued in corresponding Chinese Application No. 201710133923.8; dated Jul. 3, 2019; 10 pgs.
Second Office Action issued in corresponding Chinese Application No. 201710133923.8; dated May 9, 2020, 15 pgs.
Written Opinion issued in corresponding International Application No. PCT/CN2017/093707; State Intellectual Property Office of the P.R. China, Beijing, China, dated Dec. 13, 2017; 9 pgs.

\* cited by examiner

INTERFACE CIRCUIT, CHIP CONTAINING INTERFACE CIRCUIT AND MANUFACTURING METHOD THEREOF

RELATED APPLICATIONS

The present application is a National Phase of International Application No. PCT/CN2017/093707, filed Jul. 20, 2017, and claims the priority of China Application No. 201710133923.8, filed Mar. 8, 2017.

TECHNICAL FIELD

This disclosure generally relates to the field of electronic technologies, and more particularly relates to an interface circuit, a chip containing an interface circuit and a manufacturing method thereof.

BACKGROUND

When the existing chips are shipped from the factory, the functions of their pins would have been fixed. However, in order to realize a certain circuit function, it would be necessary to connect and package multiple chips or circuits on the same circuit board, so that the circuit function can be achieved through the cooperation of these chips. Since different chips have different arrangement requirements on their pins—that is, a pin serving the same function may have different relative positions on different chips—this will lead to crossovers of the connections among multiple chip pins. In the manufacturing process of the circuit board, however, the cross connections must be achieved by distributing different, isolated copper layers on the circuit board. With the increase of the copper layers, the number of layers of the circuit board will increase accordingly, thereby greatly increasing the complexity and cost of circuit board fabrication and packaging.

SUMMARY

The main technical problem to be solved by this disclosure is to provide an interface circuit, a chip containing an interface circuit and a manufacturing method thereof, so as to realize the customization of the circuit interfaces, thereby reducing the complexity and cost of the manufacturing and packaging of the circuit board.

To solve the above technical problem, a technical solution adopted by this disclosure is to provide an interface circuit. The interface circuit includes: an I/O processing sub-circuit, a path selection sub-circuit, and at least two I/O ports. The I/O processing sub-circuit, the path selection sub-circuit, and the at least two I/O ports are electrically connected in sequence. The I/O processing sub-circuit is configured to generate a first electrical signal to the path selection sub-circuit, and to receive a second electrical signal fed back by the path selection sub-circuit. The path selection sub-circuit is configured to: select a path to output the first electrical signal to one of the at least two I/O ports; and select a path to feed the second electrical signal that is received by one of the at least two I/O ports from an external device for the interface circuit back to the I/O processing sub-circuit. The at least two I/O ports are configured to correspond to the ports used by the external device for transmitting the first electrical signal or the second electrical signal.

In some embodiments, the path selection sub-circuit includes a first path selection sub-circuit and a second path selection sub-circuit. The first path selection sub-circuit and the second path selection sub-circuit are each electrically connected to the I/O processing sub-circuit and the I/O ports. The first path selection sub-circuit is configured to select the path to output the first electrical signal to the I/O port. The second path selection sub-circuit is configured to select the path to feed the second electrical signal that is received by the I/O port from the external device for the interface circuit back to the I/O processing sub-circuit.

In some embodiments, the first path selection sub-circuit includes at least two first path selection units. The second path sub-circuit includes at least two second path selection units. The input ports of the first path selection units are connected to the signal ports of the I/O processing sub-circuit in a one-to-one manner. The output ports of each of the first path selection units are connected to the I/O ports in a one-to-one manner. The input ports of the second path selection units are connected to the at least two I/O ports in a one-to-one manner. The output ports of each of the second path selection units are connected to the signal ports of the I/O processing sub-circuit in a one-to-one manner. At least one output port of each of the at least two first path selection units is connected to the same I/O port. At least one output port of each of the at least two second path selection units is connected to the same signal port of the I/O processing sub-circuit.

In some embodiments, the path selection sub-circuit includes at least one path selection unit. The input port and output ports of each of the at least one path selection unit are connected to a signal port of the I/O processing sub-circuit and to the at least two I/O ports, respectively.

In some embodiments, the interface circuit further includes a selection control sub-circuit configured for controlling the path selection sub-circuit to select the path.

In some embodiments, the path selection sub-circuit is a multiplexer.

In some embodiments, the path selection sub-circuit is a single-pole multi-throw switch.

In some embodiments, after the I/O ports and the ports of the external device complete the transmission of the first electrical signal and/or the second electrical signal, the path is disconnected.

In some embodiments, after the path is selected, the I/O ports and the ports of the external device are in fixed electrical communication via the path.

In some embodiments, the number of the path selection sub-circuits is less than or equal to the number of the I/O ports.

In some embodiments, the I/O processing sub-circuit and the path selection sub-circuit are integrated into an integrated circuit.

In some embodiments, the path selects one of the at least two I/O ports as an output port of the first electrical signal, or selects one of the signal ports of the I/O processing sub-circuit as an input port of the second electrical signal fed back by one of the I/O ports. In some embodiments, the I/O ports are configured to correspond to the ports of the external device used to transmit the first electrical signal or the second electrical signal.

To solve the above technical problem, another technical solution adopted by this disclosure is to provide an interface circuit. The interface circuit includes: an I/O processing sub-circuit, a path selection sub-circuit, and at least two I/O ports. The I/O processing sub-circuit, the path selection sub-circuit, and the at least two I/O ports are electrically connected in sequence. The path selection sub-circuit is configured to: select a path to output a first electrical signal to one of the at least two I/O ports. The I/O ports are configured to correspond to ports used by the external device for transmitting the first electrical signal.

In some embodiments, the path selection sub-circuit is configured to select the path allowing the arrangement of the I/O ports to correspond to the arrangement of the por of the external device used for transmitting the first electrical signal, to allow the two to be connected using one layer of circuit board.

To solve the above technical problem, still another technical solution adopted by this disclosure is to provide an interface circuit. The interface circuit includes: an I/O processing sub-circuit, a path selection sub-circuit, and at least two I/O ports. The I/O processing sub-circuit, the path selection sub-circuit, and the at least two I/O ports are electrically connected in sequence. The path selection sub-circuit is configured to: select a path to feed a second electrical signal that is received by one of the I/O ports from an external device for the interface circuit back to the I/O processing sub-circuit, where the I/O ports are configured to correspond to ports used by the external device for transmitting the second electrical signal.

In some embodiments, the path selection sub-circuit is configured to select the path allowing the arrangement of the I/O ports to correspond to the arrangement of the ports of the external device used for transmitting the second electrical signal, to allow the two to be connected using one layer of circuit board.

To solve the above technical problem, yet still another technical solution adopted by this disclosure is to provide a chip containing an interface circuit. The chip includes a signal processing circuitry and at least one of the interface circuit. The signal processing circuitry is electrically connected to the I/O processing sub-circuit of the interface circuit. The signal processing circuitry is configured to: generate various function signals of the chip, so that the function signals are transmitted to the external device through the interface circuit; and receive and process electrical signals fed back by the interface circuit.

To solve the above technical problem, still another technical solution adopted by this disclosure is to provide a method for manufacturing an electronic component. The method includes: preparing a circuit board, a first chip, and a second chip, the first chip and/or the second chip including the interface circuit; and enabling the ports of the first chip and the I/O ports of the second chip to achieve non-crossing electrical connections by means of the circuit board.

This disclosure can provide the following beneficial effects. Differing from the prior art, this disclosure selects a path through the path selection sub-circuit to output a first electrical signal generated by the I/O processing sub-circuit to an I/O port, and further selects a path to feed a second electrical signal received by an I/O port from an external device for the interface circuit back to the I/O processing sub-circuit, wherein the I/O ports are configured to correspond to the ports of the external device used for transmitting the first electrical signal or the second electrical signal. The path selected by the path selection sub-circuit can enable the first and second electrical signals to be transmitted through the I/O ports that are configured to correspond to the ports of the external device through which the first and second electrical signals are transmitted. That is, the path selection sub-circuit can customize the layout of the signal-input/output I/O ports of the interface circuit according to the layout of the ports of the external device. Therefore, it is possible to change the arrangement of the signal-input/output ports of the interface circuit, so that the arrangement of the I/O ports is consistent with the arrangement of the external device's ports. Thus, the connections between the ports do not cross each other or do so less often, thereby reducing the complexity and cost of circuit board fabrication and packaging.

BRIEF DESCRIPTION OF THE ACCOMPANYING DRAWINGS

DETAILED DESCRIPTION OF ILLUSTRATIVE EMBODIMENTS

Figure 1:
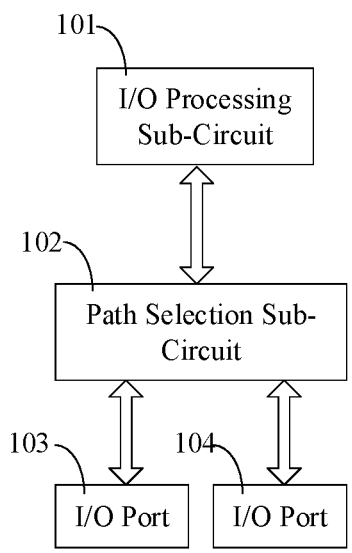
FIG. 1 is a schematic diagram of a first embodiment of an interface circuit in accordance with this disclosure.

Referring to FIG. 1, there is shown a schematic diagram of a first embodiment of an interface circuit in accordance with this disclosure. This embodiment includes: an I/O processing sub-circuit 101, a path selection sub-circuit 102, and at least two I/O ports 103 and 104. The I/O processing sub-circuit 101, the path selection sub-circuit 102, and the at least two I/O ports 103 and 104 are electrically connected in sequence.

The I/O processing sub-circuit 101 is configured to generate a first electrical signal to the path selection sub-circuit 102 and to receive a second electrical signal fed back by the path selection sub-circuit 102. The path selection sub-circuit 102 is configured to select a path to output the first electrical signal to an I/O port 103 or 104, and select a path to feed the second electrical signal that is received by an I/O port 103 or 104 from an external device for the interface circuit back to the I/O processing sub-circuit 101. The I/O ports 103 and 104 are configured to correspond to the ports of the external device used for transmitting the first electrical signal or the second electrical signal.

Optionally, in this embodiment the I/O processing sub-circuit 101 and the path selection sub-circuit 102 may be integrated into an integrated circuit.

Optionally, in this embodiment, the above path selects the I/O port 103 or 104 from the at least two I/O ports 103 and 104 as an output port of the first electrical signal, or selects a signal port from the signal ports of the I/O processing sub-circuit as an input port of the second electrical signal fed back by the I/O port 103 or 104. The I/O port 103 or 104 is configured to correspond to the port of the external device used for transmitting the first electrical signal or the second electrical signal. In an application scenario, the corresponding disposition means that when the interface circuit disclosed herein and the external device are arranged side by side, the I/O ports of the interface circuit according to this disclosure are arranged in the same manner and direction as the ports of the external device that are oppositely configured and that need to be connected. A consistent arrangement can avoid or reduce cross-connections among the ports of different circuits that serve the same function or that can be correspondingly connected.

In this embodiment, the connections between the I/O port 103 or 104 and the ports used by the external device for transmitting the first electrical signal or the second electrical signal can certainly be arranged to partially cross or partially not cross over each other, according to the actual conditions of the circuit design.

Figure 2:
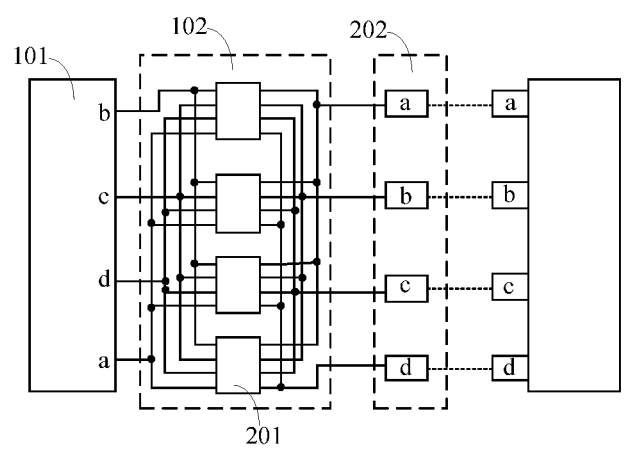
FIG. 2 is a schematic diagram illustrating a specific circuit structure in accordance with the embodiment of FIG. 1.

Referring now to FIG. 2, there is shown a schematic diagram of a specific circuit structure in accordance with the embodiment of FIG. 1. In this embodiment, the path selection sub-circuit 102 includes at least one path selection unit 201. The input port and output ports of each path selection unit 201 are connected to a signal port and to the I/O ports 202 of the I/O processing sub-circuit 101, respectively.

Figure 3:
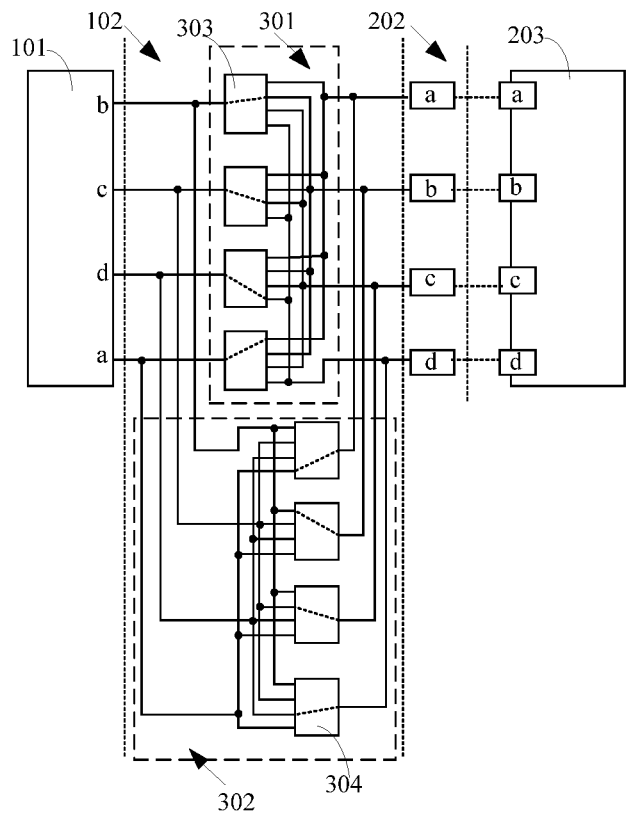
FIG. 3 is a schematic diagram illustrating another specific circuit structure in accordance with the embodiment of FIG. 1.

Optionally, referring now to FIG. 3, there is shown a schematic diagram of another specific circuit structure in accordance with the embodiment of FIG. 1. In this embodiment, the path selection sub-circuit 102 includes a first path selection sub-circuit 301 and a second path selection sub-circuit 302. The first path selection sub-circuit 301 and the second path selection sub-circuit 302 are each electrically connected to the I/O processing sub-circuit 101 and the I/O ports 202. The first path selection sub-circuit 301 is configured to select a path to output the first electrical signal to the I/O ports 202. The second path selection sub-circuit 302 is configured to select a path to feed the second electrical signal that is received by the I/O ports 202 from an external device for the interface circuit back to the I/O processing sub-circuit 101.

Optionally, the first path selection sub-circuit 301 includes at least two first path selection units 303. The second path sub-circuit 302 includes at least two second path selection units 304. The inputs of the first path selection units 303 are connected to the signal ports of the I/O processing sub-circuit 101 in a one-to-one manner. The output ports of each the first path selection units 303 are connected to the I/O ports 202 in a one-to-one manner. The input ports of the second path selection units 304 are connected to the I/O ports 202 in a one-to-one manner. The output ports of each of the second path selection units 304 are connected to the signal ports of the I/O processing sub-circuit 101 in a one-to-one manner. At least one output port of each of the at least two first path selection units 303 is connected to the same I/O port 202. At least one output port of each of the at least two second path selection units 304 is connected to the same signal port of the I/O processing sub-circuit 101.

Specifically, in this embodiment the I/O ports 203 specifically includes four I/O ports—i.e., ports a, b, c, and d—for transmitting the first electrical signals a, b, c, and d, respectively. The first path selection sub-circuit 301 and the second path selection sub-circuit 302 include four first path selection units 303 and four second path selection units 304, respectively. The first path selection sub-circuit 301 and the second path selection sub-circuit 302 are each electrically connected to the I/O processing sub-circuit 101 and the I/O ports 202.

The four first path selection units 303 respectively select paths for the first electrical signals b, c, d, a that are generated by the I/O processing sub-circuit 101 and that pass through the signal ports b, c, d, a respectively, so as to output the first electrical signals b, c, d, a to the I/O ports b, c, d, a, respectively. The four second path selection units 304 respectively paths to feed the second electrical signals a, b, c, d that are respectively received by the I/O ports a, b, c, d from the external device 203 for the interface circuit back to the signal ports a, b, c, d of the I/O processing sub-circuit, respectively. The I/O ports a, b, c, d are arranged correspondingly to the ports a, b, c, d used by the external device 203 for transmitting the first electrical signals a, b, c, d and the second electrical signals a, b, c, d.

Through the above analysis, it can be seen that the arrangement of the signal ports b, c, d, and a of the I/O processing sub-circuit 101 (signal determination ports; correspondingly, the arrangement of the I/O ports 202 are b, c, d, a) is not consistent with the arrangement of the ports a, b, c, and d of the external device 203. As such, after the chip is manufactured, the first path selection sub-circuit 301 and the second path selection sub-circuit 302 can be used to select appropriate paths to make the arrangement of the I/O ports 202 consistent with the arrangement of the ports of the external device 203, thus achieving non-crossing connections between the ports.

Optionally, in this embodiment, the path selection sub-circuits are each a multiplexer. In other embodiments, of course, the path selection sub-circuits each may also be a device with multiple selectable paths, such as a single-pole multi-throw switch.

Figure 4:
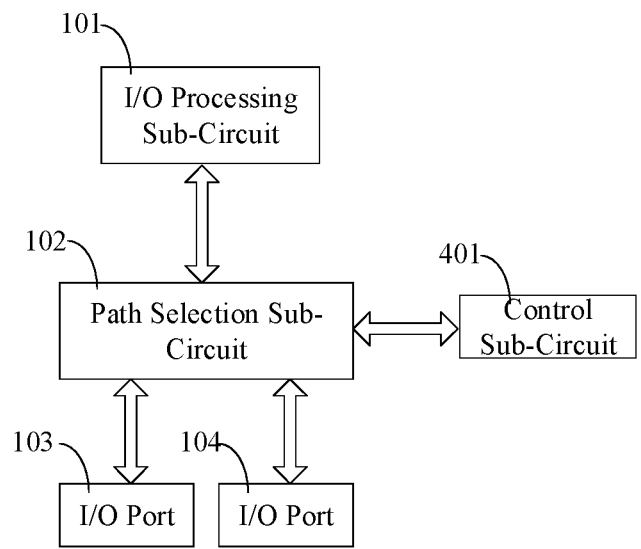
FIG. 4 is a schematic diagram of a second embodiment of an interface circuit in accordance with this disclosure.

Optionally, referring to FIG. 4, there is shown a schematic diagram of a second embodiment of an interface circuit in accordance with this disclosure. In this embodiment, a selection control sub-circuit 401 is further provided on the basis of the above embodiment, for controlling the path selection sub-circuit 102 to select the above-mentioned paths.

Specifically, taking the embodiment of FIG. 3 as an example, the control path selection sub-circuit 401 can be used to generate control signals to control the first path selection sub-circuit 301 and the second path selection sub-circuit 302 to select paths. In an application scenario, two sets of control signals can be used to control the first path selection sub-circuit 301 and the second path selection sub-circuit 302 to select paths, respectively. In other application scenarios, a same set of control signals can be used to collectively control the first path selection sub-circuit 301 and the second path selection sub-circuit 302 to select the paths, respectively.

Optionally, to facilitate the encapsulation and control of the interface circuit, in this embodiment after the I/O ports 202 and the ports of the external device 203 complete the transmission of the first electrical signal and/or the second electrical signal, the selected paths are disconnected.

Optionally, in order to realize repeated reuse of the interface circuit thus saving resources, in other embodiments, after the path is selected the I/O port 202 and the port of the external device 203 are in fixed electrical communication through this path; that is, the path is permanently maintained.

In an application scenario, the number of path selection sub-circuits of the above embodiment should be less than or equal to the number of the I/O ports.

Figure 5:
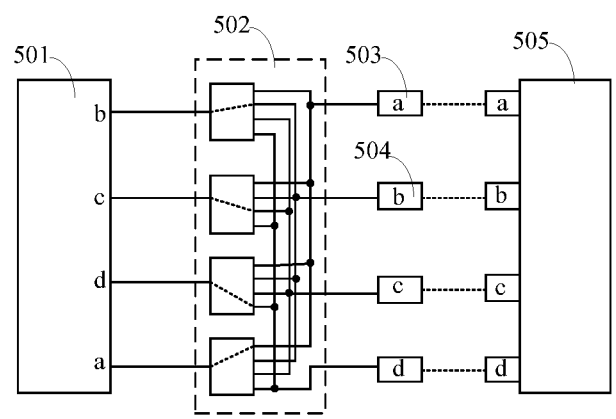
FIG. 5 is a circuit schematic of a third embodiment of an interface circuit in accordance with this disclosure.

Referring now to FIG. 5, there is shown a circuit schematic of a third embodiment of an interface circuit in accordance with this disclosure. This embodiment includes an I/O processing sub-circuit 501, a path selection sub-circuit 502, and at least two I/O ports 503 and 504. The I/O processing sub-circuit 501, the path selection sub-circuit 502, and the at least two I/O ports 503 and 504 are electrically connected in sequence. The path selection sub-circuit 502 is configured to select a path to output a first electrical signal to an I/O port 503 or 504. The I/O ports 503 and 504 are configured to correspond to the ports of an external device 505 used for transmitting the first electrical signal.

Optionally, the path selection sub-circuit 502 of this embodiment is configured to select a path allowing the arrangement of the at least two I/O ports 503 and 504 to correspond to the arrangement of the ports of the external device 505 that are used for transmitting the first electrical signal, to allow the two to be connected using one layer of circuit board.

Figure 6:
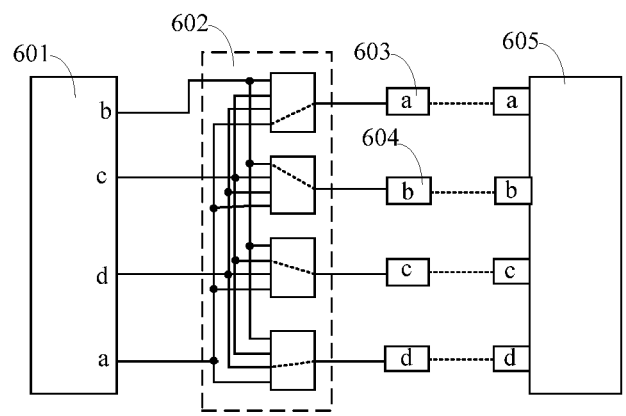
FIG. 6 is a circuit schematic of a fourth embodiment of an interface circuit in accordance with this disclosure.

Referring now to FIG. 6, there is shown a circuit schematic of a fourth embodiment of an interface circuit in accordance with this disclosure. This embodiment includes an I/O processing sub-circuit 601, a path selection sub-circuit 602, and at least two I/O ports 603 and 604. The I/O processing sub-circuit 601, the path selection sub-circuit 602, and at least two I/O ports 603 or 604 are electrically connected in sequence. The path selection sub-circuit 602 is configured to select a path to feed a second electrical signal that is received by one of the I/O ports 603 and 604 from an external device 605 for the interface circuit back to the I/O processing sub-circuit 601. The I/O port 603 or 604 is set corresponding to the port used by the external device 605 for transmitting the second electrical signal.

Optionally, the path selection sub-circuit 602 of this embodiment is configured to select a path allowing the arrangement of the at least two I/O ports 603 and 604 to correspond to the arrangement of the ports of the external device 605 that are used for transmitting the second electrical signal, to allow the two to be connected using one layer of circuit board.

Figure 7:
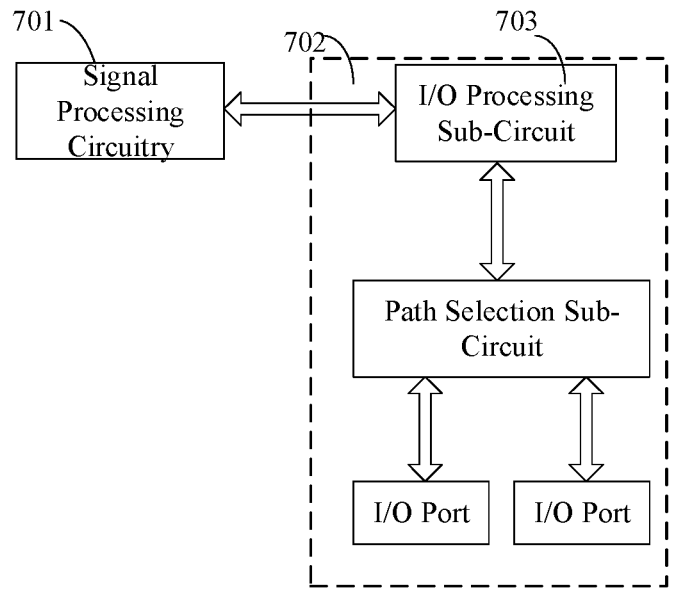
FIG. 7 is a schematic diagram of an embodiment of a chip containing an interface circuit in accordance with this disclosure.

Referring now to FIG. 7, there is shown a schematic diagram of an embodiment of a chip containing an interface circuit in accordance with this disclosure. This embodiment includes a signal processing circuitry 701 and an interface circuit 702 of the above embodiments. The signal processing circuitry 701 is electrically connected to the I/O processing sub-circuit 703 of the interface circuit 702. The signal processing circuitry 701 is configured to: generate various function signals of the chip, and then the function signals are transmitted to an external device through the interface circuit 702; and receive and process the electrical signals fed back by the interface circuit 702.

Since the structure and working principles of the interface circuit 702 of this embodiment as well as the information transmission between the interface circuit 702 and the external device, etc. have been described in detail in the above embodiments, they are not to be repeated here again.

Figure 8:
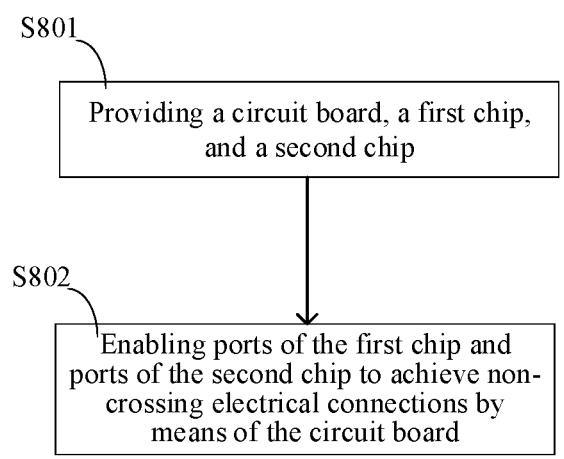
FIG. 8 is a flowchart of an illustrative embodiment of a method for manufacturing an electronic component in accordance with this disclosure.

Referring now to FIG. 8, there is shown a flowchart of an illustrative embodiment of a method for manufacturing an electronic component in accordance with this disclosure. This embodiment includes the following steps S801 and S802.

In step S801, the method includes preparing a circuit board, a first chip, and a second chip.

The first chip and/or the second chip include the interface circuit of the above embodiments.

In step S802, the method includes enabling the ports of the first chip and the ports of the second chip to achieve non-crossing electrical connections by means of the circuit board.

Differing from the prior art, according to this embodiment the path selected by the path selection sub-circuit can enable the first and second electrical signals to be transmitted through the I/O port that is configured to correspond to the port of the external device through which the first and second electrical signals are transmitted. That is, the path selection sub-circuit can customize the layout of the signal-input/output I/O ports of the interface circuit according to the layout of the ports of the external device. Therefore, it is possible to change the arrangement of the signal-input/output ports of the interface circuit, so that the arrangement of the I/O ports is consistent with the arrangement of the external device's ports. Thus, the connections between the ports do not cross each other or do so less often, thereby reducing the complexity and cost of circuit board fabrication and packaging.

It should be noted that the interface circuit and the chip containing the interface circuit according to this disclosure are applicable to but not limited to a single-layer circuit board, and may also be a multilayer circuit board.

The foregoing description merely portrays some illustrative embodiments according to the disclosure and therefore is not intended to limit the patentable scope of the disclosure. Any equivalent structural or flow transformations that are made taking advantage of the specification and accompanying drawings of the disclosure and any direct or indirect applications thereof in other related technical fields shall all fall in the scope of protection of the disclosure.

What is claimed is:

1. An interface circuit, comprising:
   an I/O processing sub-circuit;
   a path selection sub-circuit; and
   at least two I/O ports;
   wherein the I/O processing sub-circuit, the path selection sub-circuit, and the at least two I/O ports are electrically connected in sequence;
   the I/O processing sub-circuit is configured to generate a first electrical signal to the path selection sub-circuit, and receive a second electrical signal fed back by the path selection sub-circuit;
   the path selection sub-circuit is configured to select a path to output the first electrical signal to one of the at least two I/O ports; and select a path to feed the second electrical signal that is received by one of the at least two I/O ports from an external device for the interface circuit back to the I/O processing sub-circuit, where the at least two I/O ports are configured to correspond to ports used by the external device for transmitting the first electrical signal or the second electrical signal, the at least two I/O ports corresponding to ports used by the external device indicating that when the interface circuit and the external device are arranged side by side, the at least two I/O ports of the interface circuit are arranged in a same manner and in a same direction as the ports of the external device.

2. The interface circuit according to claim 1, wherein the path selection sub-circuit comprises a first path selection sub-circuit and a second path selection sub-circuit, each of which being electrically connected to the I/O processing sub-circuit and the at least two I/O ports;
   the first path selection sub-circuit is configured to select the path to output the first electrical signal to the I/O port;
   the second path selection sub-circuit is configured to select the path to feed the second electrical signal received by the I/O port from the external device for the interface circuit back to the I/O processing sub-circuit.

3. The interface circuit according to claim 2, wherein the first path selection sub-circuit comprises at least two first path selection units, and the second path selection sub-circuit comprises at least two second path selection units;

respective input ports of the first path selection units are connected to signal ports of the I/O processing sub-circuit in an one-to-one manner; output ports of each of the first path selection units are connected to the I/O ports in an one-to-one manner;

respective input ports of the second path selection units are connected to the at least two I/O ports in an one-to-one manner; output ports of each of the second path selection units are connected to the signal ports of the I/O processing sub-circuit in an one-to-one manner; and at least one output port of each of the at least two first path selection units is connected to a same I/O port, and at least one output port of the at least two second path selection units is connected to a same signal port of the I/O processing sub-circuit.

4. The interface circuit according to claim 1, wherein the path selection sub-circuit comprises at least one path selection unit, and an input port and output ports of each of the at least one path selection unit are connected to a signal port of the I/O processing sub-circuit and the at least two I/O ports, respectively.

5. The interface circuit according to claim 1, further comprising:
a selection control sub-circuit, configured to control the path selection sub-circuit to select the path.

6. The interface circuit according to claim 1, wherein the path selection sub-circuit is a multiplexer.

7. The interface circuit according to claim 1, wherein the path selection sub-circuit is a single-pole multi-throw switch.

8. The interface circuit according to claim 1, wherein after the I/O ports and the ports of the external device complete the transmission of the first electrical signal and/or the second electrical signal, the path is disconnected.

9. The interface circuit according to claim 1, wherein after the path is selected, the I/O ports and the ports of the external device are in fixed electrical communication via the path.

10. The interface circuit according to claim 9, wherein the number of the path selection sub-circuits is less than or equal to the number of the I/O ports.

11. The interface circuit according to claim 1, wherein the I/O processing sub-circuit and the path selection sub-circuit are integrated into an integrated circuit.

12. The interface circuit according to claim 1, wherein the path selects one of the at least two I/O ports as an output port of the first electrical signal, or selects one of signal ports of the I/O processing sub-circuit as an input port of the second electrical signal fed back by one of the I/O ports; the I/O ports are configured to correspond to ports used by the external device for transmitting the first electrical signal or the second electrical signal.

13. An interface circuit, comprising:
an I/O processing sub-circuit;
a path selection sub-circuit; and
at least two I/O ports;
wherein the I/O processing sub-circuit, the path selection sub-circuit, and the at least two I/O ports are electrically connected in sequence;
the path selection sub-circuit is configured to select a path to output a first electrical signal to one of the at least two I/O ports; the at least two I/O ports are configured to correspond to ports used by the external device for transmitting the first electrical signal, the at least two I/O ports corresponding to ports used by the external device indicating that when the interface circuit and the external device are arranged side by side, the at least two I/O ports of the interface circuit are arranged in a same manner and in a same direction as the ports of the external device.

14. The interface circuit according to claim 13, wherein the path selection sub-circuit is configured to select the path, allowing an arrangement of the I/O ports to correspond to an arrangement of the ports of the external device used for transmitting the first electrical signal, to allow the two to be connected using one layer of circuit board.

15. An interface circuit, comprising:
an I/O processing sub-circuit;
a path selection sub-circuit; and
at least two I/O ports;
wherein the I/O processing sub-circuit, the path selection sub-circuit, and the at least two I/O ports are electrically connected in sequence;
the path selection sub-circuit is configured to select a path to feed a second electrical signal that is received by one of the at least two I/O ports from an external device for the interface circuit back to the I/O processing sub-circuit, where the at least two I/O ports are configured to correspond to ports used by the external device for transmitting the second electrical signal, the at least two I/O ports corresponding to ports used by the external device indicating that when the interface circuit and the external device are arranged side by side, the at least two I/O ports of the interface circuit are arranged in a same manner and in a same direction as the ports of the external device.

16. The interface circuit according to claim 15, wherein the path selection sub-circuit is configured to select the path, allowing an arrangement of the I/O ports to correspond to an arrangement of the ports of the external device used for transmitting the second electrical signal, to allow the two to be connected using one layer of circuit board.

17. A chip comprising an interface circuit, the chip comprising:
a signal processing circuitry; and
an interface circuit comprising:
an I/O processing sub-circuit;
a path selection sub-circuit; and
at least two I/O ports;
wherein the I/O processing sub-circuit, the path selection sub-circuit, and the at least two I/O ports are electrically connected in sequence;
the I/O processing sub-circuit is configured to generate a first electrical signal to the path selection sub-circuit, and receive a second electrical signal fed back by the path selection sub-circuit:
the path selection sub-circuit is configured to select a path to output the first electrical signal to one of the at least two I/O ports; and select a path to feed the second electrical signal that is received by one of the at least two I/O ports from an external device for the interface circuit back to the I/O processing sub-circuit, where the at least two I/O ports are configured to correspond to ports used by the external device for transmitting the first electrical signal or the second electrical signal, the at least two I/O ports corresponding to ports used by the external device indicating that when the interface circuit and the external device are arranged side by side, the at least two I/O ports of the interface circuit are arranged in a same manner and in a same direction as the ports of the external device;
wherein the signal processing circuitry is electrically connected to the I/O processing sub-circuit of the interface circuit;

the signal processing circuitry is configured to generate various function signals of the chip, so that the function signals are transmitted to the external device via the interface circuit; and receive and process electrical signals fed back by the interface circuit.

18. A method for manufacturing an electronic component, comprising:
- providing a circuit board, a first chip, and a second chip, the first chip and/or the second chip comprising an interface circuit; and
- enabling ports of the first chip and I/O ports of the second chip to achieve non-crossing electrical connections by means of the circuit board;
- wherein the interface circuit comprises:
- an I/O processing sub-circuit;
- a path selection sub-circuit; and
- at least two I/O ports;
- wherein the I/O processing sub-circuit, the path selection sub-circuit, and the at least two I/O ports are electrically connected in sequence;
- the I/O processing sub-circuit is configured to generate a first electrical signal to the path selection sub-circuit, and receive a second electrical signal fed back by the path selection sub-circuit;
- the path selection sub-circuit is configured to select a path to output the first electrical signal to one of the at least two I/O ports; and select a path to feed the second electrical signal that is received by one of the at least two I/O ports from an external device for the interface circuit back to the I/O processing sub-circuit, where the at least two I/O ports are configured to correspond to ports used by the external device for transmitting the first electrical signal or the second electrical signal, the at least two I/O ports corresponding to ports used by the external device indicating that when the interface circuit and the external device are arranged side by side, the at least two I/O ports of the interface circuit are arranged in a same manner and in a same direction as the ports of the external device.

* * * * *